United States Patent
Chih et al.

(10) Patent No.: US 8,687,412 B2
(45) Date of Patent: Apr. 1, 2014

(54) REFERENCE CELL CONFIGURATION FOR SENSING RESISTANCE STATES OF MRAM BIT CELLS

(75) Inventors: Yue-Der Chih, Hsin-Chu (TW);
Chun-Jung Lin, HsinChu (TW);
Kai-Chun Lin, Hsin-Chu (TW);
Hung-Chang Yu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 25 days.

(21) Appl. No.: 13/438,006

(22) Filed: Apr. 3, 2012

(65) Prior Publication Data

US 2013/0258762 A1 Oct. 3, 2013

(51) Int. Cl.
*G11C 11/00* (2006.01)
(52) U.S. Cl.
USPC .......................................... 365/158; 365/173
(58) Field of Classification Search
USPC .................................................. 365/158, 173
See application file for complete search history.

(56) References Cited

U.S. PATENT DOCUMENTS

| | | | |
|---|---|---|---|
| 8,004,880 B2 | 8/2011 | Yoon et al. | |
| 2009/0067212 A1 | 3/2009 | Shimizu | |
| 2009/0201717 A1 | 8/2009 | Maeda et al. | |
| 2009/0273967 A1* | 11/2009 | Schroegmeier et al. | 365/158 |
| 2010/0135066 A1* | 6/2010 | Jung et al. | 365/158 |
| 2010/0232211 A1* | 9/2010 | Liu et al. | 365/148 |
| 2011/0157971 A1 | 6/2011 | Kim et al. | |

FOREIGN PATENT DOCUMENTS

KR 10-2011-0078181 7/2011

OTHER PUBLICATIONS

Kim, J.P. et al., "A 45nm 1Mb Embedded STT-MRAM with design techniques to minimize read-disturbance", 2011 Symposium on VLSI Circuits (VLSIC), Jun. 2011, pp. 296-297.
Hai et al., "Design Methodologies and Circuit Techniques for Emerging Non-Volatile Memories", 23 pages.
Huai, Y., "Spin-Transfer Torque MRAM (STT-MRAM):Challenges and Prospects", AAPPS Bulletin, Dec. 2008, 18(6):33-40.
Chen, Y. et al., A Nondestructive Self-Reference Scheme for Spin-Transfer Torque Random Access Memory (STT-RAM), Automation & Test in Europe Conference & Exhibition Design, Mar. 2010, pp. 148-153.
Official action issued on Jul. 18, 2013, in counterpart Korean Patent Application No. 10-2012-0065501.
Office Action dated Dec. 6, 2013 in counterpart German Application 10 2013 102 437.8.

* cited by examiner

*Primary Examiner* — Michael Tran
(74) *Attorney, Agent, or Firm* — Duane Morris LLP

(57) ABSTRACT

A reference circuit discerns high or low resistance states of a magneto-resistive memory element such as a bit cell. The reference circuit has magnetic tunnel junction (MTJ) elements in complementary high and low resistance states $R_H$ and $R_L$, providing a voltage, current or other parameter for comparison against the memory element to discern a resistance state. The parameter represents an intermediate resistance straddled by $R_H$ and $R_L$, such as an average or twice-parallel resistance. The reference MTJ elements are biased from the same read current source as the memory element but their magnetic layers are in opposite order, physically or by order along bias current paths. The reference MTJ elements are biased to preclude any read disturb risk. The memory bit cell is coupled to the same bias polarity source along a comparable path, being safe from read disturb risk in one of its two possible logic states.

19 Claims, 6 Drawing Sheets

REFERENCE CELL CONFIGURATION FOR SENSING RESISTANCE STATES OF MRAM BIT CELLS

BACKGROUND

This disclosure concerns methods and apparatus for discerning the logic levels stored in magnetic memory elements as represented by changeable high and low resistance states. For determining the present resistance state of an element, one or more parameters that vary with the resistance of the element are compared against corresponding parameters in a reference circuit.

The reference circuit has one or more reference magnetic memory elements that exemplify both high and low resistance states. The basis of comparison is a level of the parameter falling between parameter levels exemplifying the high and low resistance states, used as a comparison threshold. In one embodiment, an average of current amplitudes through magnetic elements in respective high and low resistance states is compared against a current amplitude in an element to be read out. The result of the comparison denotes whether the element is in a high or low resistance state.

In an embodiment, a same bias current polarity is used for sensing the resistances of the memory element and also the comparison cells, developing voltages that are coupled to the inputs of a voltage comparator. More particularly, the differing fixed or changeable magnetic layers of the high and low resistance comparison cells are arranged in opposite polarity orientations relative to the source of current bias, while the same polarity is used for the source current to both the high and low resistance legs of the reference circuit. This provides a simple and effective circuit for reading out bit values.

The specific current polarity and relative orientation of the magnetic layers are those that avoid risk of read-disturb errors at the comparison cells of the reference circuit, for both the high and low resistance states. However a read-disturb risk remains as to the memory element to be read out, namely if the memory element happens to be in the particular resistance state that is vulnerable to read-disturb errors at the applied current bias polarity. The logic state of the memory element being read out is not initially known, so a read disturb risk is unavoidable at certain combinations of current bias polarity, magnetic element orientation in the circuit, and high or low resistance state.

A spin-transfer torque magneto-resistive random access memory (STT-MRAM) stores data values in storage elements having two superimposed layers of magnetic material separated by a thin insulating film, defining a magnetic tunnel junction or "MTJ". The two layers include a magnetic layer that is permanently magnetized in a fixed magnetic field alignment direction, and a changeably-magnetized magnetic layer.

The changeably-magnetized magnetic layer can be magnetized in one of two orientations relative to the permanently magnetized layer. The two orientations are characterized by distinctly different serial resistances through the superimposed layers of the MTJ. The magnetic field orientation of the changeable layer can be aligned the same as that of the permanent magnet layer (parallel), or the magnetic field of the changeable layer can be aligned directly opposite to that of the permanent magnet layer (anti-parallel). The parallel alignment state has a relatively lower resistance and the anti-parallel alignment state has a higher resistance. These two states as sensed from their relatively higher or lower resistances ($R_H$ and $R_L$) represent different binary logic values of bits in the memory.

The thin insulating layer can comprise magnesium oxide (MgO), for example. The permanent magnet layer is a reference layer and can be termed the "pinned" layer or the pinned magnetic plate. The changeable magnetic layer or plate is termed the "free" layer. When the free layer of a bit cell comprising an MTJ has been magnetized in one alignment direction or the other relative to the field alignment of the reference layer, that condition persists without the need to maintain electrical power to the bit cell. The memory is nonvolatile. A semiconductor memory using MTJ elements can be scaled to a small cell size, requires little power for read and write operations, and functions at frequencies comparable to volatile memory types employing latches or cross coupled inverters, but without comparable levels of current leakage.

For reading the logic value of an MTJ bit cell, a bias current is applied serially through the superimposed magnetic layers, causing a bit cell read voltage to be developed. Assuming that a same bias current amplitude is applied, a voltage amplitude is generated according to Ohm's Law, V=IR, that differs with the serial resistance through the MTJ and superimposed magnetic layers. A higher or lower voltage at the same bias current level indicates whether the bit cell layers are magnetized in their parallel or anti-parallel states.

Using a voltage comparator having a reference voltage level coupled to one comparator input and the bit cell to be read out coupled to the other comparator input, the voltage across the bit cell is compared to the reference voltage and the output of the comparator represents the logic value read out from the bit cell.

An ideal reference voltage level is the voltage that would result from applying the read current to a resistance that is between the high resistance value $R_H$ and low resistance value $R_L$ and preferably is well spaced from both $R_H$ and $R_L$, such as halfway between them. However, manufacturing variations are such that the $R_H$ and $R_L$ resistances encountered in manufactured MRAM bit cell arrays can vary. Small differences in the thickness of the magnesium oxide or other barrier layer between the magnetic layers can have a particular effect on the resistances $R_H$ and $R_L$.

It is possible to provide a voltage comparator coupled to a voltage reference amplitude for each bit cell position in addressable memory words. Switched addressing arrangements are possible for banks of cells, for addressable memory words, etc., in addressed and/or time division multiplexed arrangements. For simplifying this discussion, it can be assumed as a nonlimiting example that plural voltage comparators are provided, one comparator for each bit position of any memory word that is gated or addressed to the comparison circuit. In that example, the bit values for all the bit cells in a memory word are read out in parallel when the bit cells are commonly addressed by a decoded memory word line signal.

The reference voltage applied to the comparators for the bit cells (or for some subset of bit cells such as bit cells at a given bit position) might be determined in various ways. For example, a voltage divider with fixed resistance values between a power supply voltage and ground can define a fixed reference voltage at the junction between the fixed resistances.

One might attempt to define a fixed reference voltage that is slightly below the lowest expected voltage produced by a nominal read-current amplitude through any of the bit cells when in their high resistance state. All bit cell read voltages that produce a read voltage below that may be assumed to be in the low resistance state. Similarly, one could define a reference voltage that is slightly higher the highest expected voltage produced by a nominal read-current amplitude through a bit cell in its low resistance state. All bit cell read voltages that produce a read voltage higher than that may be assumed to be in the high resistance state. These techniques, briefly, use the lowest high resistance or the highest low resistance as the threshold for comparison. Such a configuration would not be optimal because the difference between the comparison threshold and the corresponding memory element value would be small for some of the memory elements being read out. Any offset in the operation of the comparators could produce errors. A better comparison threshold would be well spaced between the lowest high resistance and the highest low resistance.

It may be difficult or impossible to predict a reference voltage that falls at an optimal resistance that is spaced between the lowest high resistance value $R_H$ and the highest low resistance value $R_L$ of manufactured MRAM circuit chips. A reference value selected appropriately for one chip may be incorrect for another chip. Attempting to use the same reference voltage for chips whose actual $R_H$ and $R_L$ values are distributed over a statistical population will reduce selections. Some of the chips will have an unduly high proportion of bit cells that cannot be accurately written and read out.

Instead of predicting a fixed reference voltage, a reference voltage can be derived from one or more reference MTJ elements that are manufactured in the same process as the bit cells. If manufacturing variations affect the bit cells (such as variation in the thickness of the magnesium oxide barrier layer) the same variations similarly affect the reference elements. The reference voltage in that case is more accurately optimized for the MTJ elements that are manufactured together. One or more MTJ elements that are known to be in their high resistance state $R_H$ and one or more MTJ elements known to be in their low resistance state $R_L$, are biased with a read current and produce voltages from which a reference threshold voltage is derived and coupled to one input of a voltage comparator. The same read current amplitude is applied to a bit cell whose logic value is being read out, and the output of the voltage comparator is the bit cell logic value. What is needed is a simple, dependable and accurate configuration to accomplish this.

When setting the resistance state of an MTJ element that is used in a bit cell, namely when writing a logic value into the bit cell, the required alignment can be imposed onto the free layer, namely by magnetizing the free layer in the necessary direction relative to the pinned layer to define a high resistance (anti-parallel) or low resistance (parallel) alignment state. A spin-transfer torque (STT) cell is advantageous in that the alignment of the magnetic field in the free layer can be changed simply by passing a write current of the required polarity to align the free layer in one direction or the other, and at least a minimum write current amplitude, through the magnetic tunnel junction MTJ element. The polarity needed to change the resistance state from low to high is different from the polarity needed to change from high to low.

When sensing the resistance level of the MTJ element, it is also necessary to apply a current bias for reading purposes. One may avoid inadvertently writing a new alignment state onto an MTJ element (a "read-disturb" error), by keeping the read current amplitude less than the amplitude that might cause realignment of the free layer. A read-disturb error would not be possible if the read current is applied at the polarity that would retain the present alignment of the free layer unchanged in its parallel or anti-parallel state. But the logic value of the bit cell is unknown when commencing a read operation. As a result, the read bias current for bit cells when applying a read current bias is kept low.

In the situation where one provides two or more reference MTJ elements for use as opposite-state resistance references when determining the resistance state (reading out a stored logic value) of a memory MTJ element having a logic state that is unknown, at least one of the reference MTJ elements is necessarily in a different resistance state from the memory MTJ element that is being read out. It seems that in such a case, whether a positive current polarity or a negative current polarity is used to sense the resistance of the MTJ element being read out, there is always a read-disturb risk to the memory MTJ element being read out and also to one of the two elements of the reference circuit. At any read bias current polarity, the memory MTJ element to be read out is at risk if it happens to be in the vulnerable one of its two possible logic states. At any read bias polarity, one of the two reference MTJ elements that are in opposite resistance states is biased in its direction that is vulnerable to read-disturb errors (although the vulnerable one might be the high resistance MTJ or the low resistance MTJ, depending on the direction of current bias). It seems impossible to resolve the possible current bias possibilities to the reference circuit and also to the MTJ element to be read out, in a manner that does not risk a read-disturb error to the memory MTJ element and one of the two reference MTJ elements. What is needed is to manage the risk of read disturb errors as well as to optimize the configuration of the MTJ elements in the reference section coupled to a sense amplifier in an STT-MRAM memory circuit.

SUMMARY

It is an object of the present disclosure to provide an effective configuration to define a reference value against which a comparison can be made to sense the value stored in an MRAM bit cell. A value of resistance, voltage or current (these parameters being related by Ohm's Law) is defined at a point between the values of corresponding parameters of at least two MRAM MTJ elements known to be in different resistance states due to parallel and anti-parallel MTJ magnetic layer alignments, those elements being used as reference MTJ elements. An embodiment is provided for using the average resistance, voltage and/or current as the reference presented as one input to an appropriate comparison circuit. The other input of the comparison circuit is coupled to an MRAM memory MTJ element that is or is part of a memory bit cell or other value storage register, whose resistance state is to be sensed. The output of the comparison circuit is regarded as the sensed resistance state of the MRAM memory MTJ element that is being sensed.

According to one aspect, the reference value used as a reference is represented by the average current in the parallel resistances of two paired magnetic tunnel junctions coupled to the same voltage and from which read bias current is supplied. These are the reference MTJ elements and are kept in opposite ones of their high and low resistance states. The current drawn from the current supply is the sum of currents through MTJ elements at resistance states $R_H$ and $R_L$. The sum of currents through both resistance states $R_H$ and $R_L$ is a total current that is twice the average current. With division by two, the average current is compared by a latch arrangement operating as a comparator whose output value is the logical representation of whether the resistance of a subject bit cell is higher or lower than the average high and low resistances of the two MTJ elements used to produce the reference value.

An object is to provide circuit configurations and techniques that are optimal for use as references for comparison when distinguishing between the high and low resistance states of bit cells that are in unknown resistance states. In certain embodiments, the MTJ elements used in defining a reference value are based on averages relating to voltages at equal read current amplitude. In other embodiments, the averages relate to summed current amplitudes through two MTJ elements maintained in different $R_H$ and $R_L$ resistance states. The MTJ elements used as references are produced in the same manufacturing process as the bit cells, and thus are equally affected by process variations. Plural reference cells and comparators can be provided, such as one set of reference cells and a comparator for each bit position to which a bit cell of an addressed memory word is coupled during a memory read operation.

According to another aspect, the MTJ elements in the reference section, namely the MTJ elements with high and low resistance states $R_H$ and $R_L$, respectively, are arranged with their free and pinned magnetic layers in opposite order relative to the current bias polarity. The polarity of the read currents applied to both MTJ elements in the reference section is effectively at the polarity that is safe from producing a read disturb error. Preferably, it is known which of the MTJ elements in the reference section is in its high resistance state and which is in its low resistance state, and those states are not changed. The read bias current supplied to the reference MTJ elements is at the polarity that keeps the MTJ elements in their present parallel or anti-parallel alignment states.

In an embodiment, the reference MTJ elements in the reference section are coupled to the same source of read bias current that is coupled to the memory MTJ element. The source of read bias current applies the same polarity of read bias current to the circuit legs in the reference circuit containing the MTJ elements in the parallel alignment state and the anti-parallel state. This provides a simple circuit arrangement because similar circuits couple the read bias current to the memory MTJ element and the reference MTJ elements. However the current bias is caused to flow in opposite polarity order through the pinned and free layers of the two MTJ element used in the two circuit legs of the reference section that provide an average current.

The polarity order through the pinned and free layers of the two reference MTJ elements can be made opposite by depositing the free and pinned layers in different order, one after the other, during an epitaxial manufacturing process. Alternatively, the manufacturing process produces deposited magnetic layers in the same order, but the conductors that couple the layers of the respective MTJ elements serially into their respective legs of the reference circuit, run in different directions through the free layer, the insulating barrier and the pinned layer of the two elements.

The logic state of the memory MTJ element is known and in either read bias current polarity, there is a risk of read-disturb error. But the reference MTJ elements remain in a known state, and the read bias current polarity is selected as the polarity that is free of read-disturb risk to both reference MTJ elements in the reference section. The same read bias current source is applied to the memory MTJ element, which simplifies the circuit configuration. Thus, the MTJ elements used to define the average parameter value of parallel and anti-parallel aligned reference MTJ elements coupled to a comparator in the sensing circuits of an MRAM device are arranged with their pinned and free magnetic layers in opposite order. Both are coupled at the current bias polarity that is free of read-disturb risk in their respective parallel and anti-parallel states. The same current bias polarity is applied to the memory MTJ element, which runs a read disturb risk in one of its two possible logic states.

Additional objects and aspects of this disclosure will become evident from the following discussion of exemplary embodiments.

BRIEF DESCRIPTION

There are shown in the drawings certain exemplary embodiments intended to illustrate aspects of the subject matter disclosed. The subject developments are not limited to the embodiments illustrated as examples, and reference should be made to the claims to assess the scope of the subject matter. In the drawings, FIG. 1 is an isometric view showing the physical parts of a magnetic tunnel junction element (MTJ).

FIG. 2 is a schematic diagram showing the circuit elements found in FIG. 1 as coupled to a read/write and bias current generating element and providing an input to a voltage comparator.

FIG. 3 is a schematic illustration of read-sense circuit wherein an MTJ element in a high resistance state and an MTJ element in a low resistance state are coupled to a common current source in a reference circuit so as to produce a measure of average current based on parallel resistances, and the reference circuit is coupled as one input to a PMOS comparator having a second input coupled to a bit cell whose resistance level is being read out.

DETAILED DESCRIPTION

Figure 1:
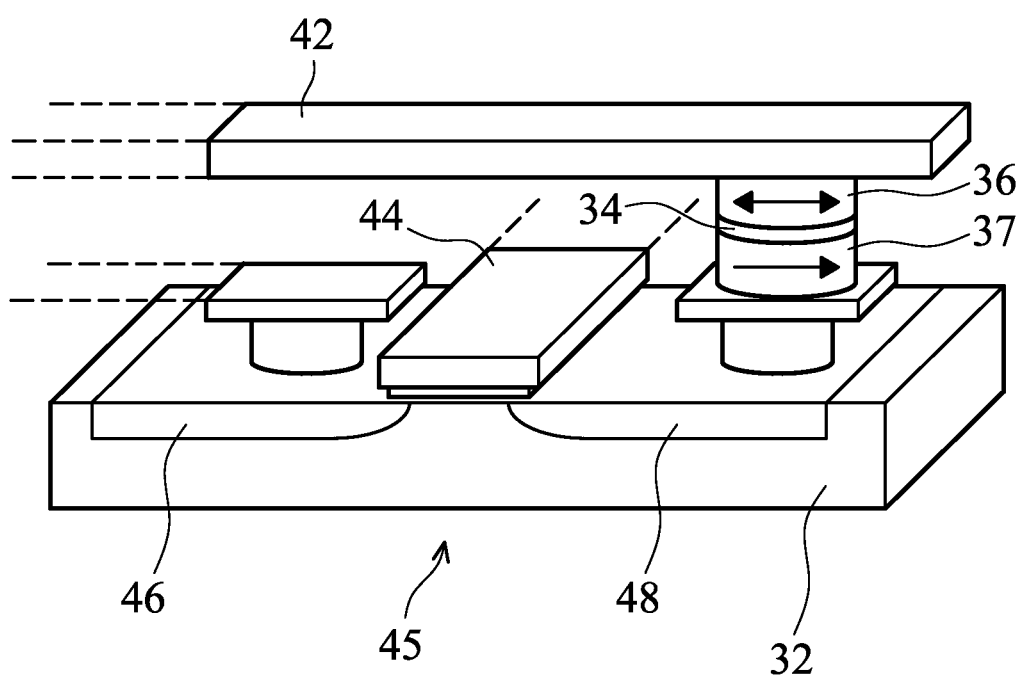

Methods and circuits are provided herein for discerning a binary logic state of bit cells or other data storage elements comprising magnetic memory devices. A magneto-resistive random access memory (MRAM) is an example, wherein the logic values of addressable bit cells reside in the high resistance or low resistance state of magnetic memory elements.

According to one aspect, the high or low resistance state of a magnetic memory data storage element such as a bit cell whose stored logical data is being read out, is distinguished using a two input voltage or current comparator coupled on one hand to a voltage or current signal from the data storage element and on the other hand to a comparable voltage or current value from a circuit defining a reference value. The characteristic defining two possible logic values is the high or low resistance state of the MRAM data storage element, such as a bit cell. The comparison reference input to the comparator is derived as a value between high and low resistances of MRAM reference elements. In an embodiment discussed in detail, one MRAM MTJ reference element is kept in the high resistance $R_H$ state and another MRAM MTJ element is kept in the low resistance $R_L$ state. These MRAM MTJ elements are dedicated to providing a reference for input to a comparison circuit using a voltage or current comparison to determine whether the resistance of a MRAM memory MTJ element (such as an element in a bit cell) is higher or lower than the reference value determined from $R_H$ and $R_L$ resistances of the reference MRAM reference MTJ elements.

The reference level for comparison is derived from resistances between those characteristic of $R_H$ and $R_L$ resistance states. In an embodiment, the reference level is derived from the sum or average current of $R_H$ and $R_L$ resistances coupled in parallel legs of a reference circuit coupled to the same read bias current source, which source is also coupled to provide read bias current to the memory MTJ element whose resistance is being sensed. The comparison senses whether a parameter that varies with resistance, in the memory MTJ element or the bit cell when applied to a current bias source, is higher or lower than an average of the corresponding average of that parameter in the two legs of a comparison circuit respectively containing an MTJ reference element in an $R_H$ high resistance state and an MTJ reference element in an $R_L$ low resistance state, as coupled to the same polarity current bias source. Instead of using an average, one can use a different function such as a parameter based on twice the parallel resistance $(2*R_H*R_L/(R_H+R_L))$ or another value that is known to be straddled by $R_H$ and $R_L$ and is well spaced between $R_H$ and $R_L$.

The technique is accomplished using a current or voltage comparison technique. Resistance is sensed indirectly according to Ohm's Law V=IR. At a given current bias, for example, the high and low resistance states are characterized by producing higher or lower voltages across the MRAM element, namely across a superimposed pinned magnetic layer, barrier film and free magnetic layer forming a magnetic tunnel junction or MTJ. Similarly, at equal source voltages, two current sinks through the $R_H$ and $R_L$ resistances of two MRAM MTJ reference cells draw current from the source equal to the sum of the currents determined by Ohm's Law using a given voltage and resistances $R_H$ and $R_L$.

In this way, a reference value based on a resistance between $R_H$ and $R_L$ is determined from two MRAM MR reference elements, one being in the high resistance state and the other in the low resistance state. The reference value and the comparable parameter produced by the bit cell whose logic value is being sensed, are applied as two inputs to a comparator. For example, the voltage across the average resistance at nominal current is compared by a voltage comparator versus the voltage across the bit cell resistance at that nominal current. The MRAM reference elements can be dedicated MRAM reference cells, each comprising a pinned layer and free layer, superimposed and separated by a thin insulating layer such as magnesium oxide. The reference circuit produces voltage or current parameters in different embodiments. The output of the comparator represents the high or low resistance state of the memory MTJ element, and its sensed logic value in the bit cell.

The memory bit cells using magnetoresistive techniques as provided herein use two magnetic tunnel junction (MTJ) elements. Each MTJ element comprises a pair of magnetic layers that are either in a low resistance state because the magnetic field orientations of the two layers are parallel, or in a high resistance state because the magnetic field orientations of the two layers are anti-parallel. The two MTJ elements that together define the reference used for comparison in the sensing circuit are maintained in complementary states. That is, one MTJ element is in a high resistance state while the other in a low resistance state, and vice versa. The resistance states provide a measure for comparison with a bit cell, the output of the comparison being the logic value of the bit cell.

The average of $R_H$ and $R_L$ resistances of the two MTJ reference elements applied to one input of the comparator is likely to be greater than the low resistances and less than the high resistances of most or all of the MTJ elements in the MRAM memory array. The average current based on parallel resistances of the two elements is also likely to be less than the high current at $R_L$ resistance and greater than the low current at $R_H$ resistance for such elements. Similar statements can be made about other parameters that vary with resistance (such as voltage), other things being equal (including current bias amplitude). The average or median-straddled parameter values of the two MTJ elements (in two logic states) provides a threshold used to distinguish whether memory MTJ elements are in their high resistance or low resistance states. Thus, circuits are possible that compare any such qualifying parameter.

An average parameter value can be obtained from two reference cells a and b of which one is at $R_H$ and the other is at $R_L$. Assuming that voltage or another parameter is linearly related to resistance, the voltage comparator reference input is then at average voltage obtained from $(R_{H(a)}+R_{L(b)})/2$. A bit cell resistance higher or lower than the average is concluded to be at its resistance state $R_H$ or $R_L$, respectively.

In some embodiments, instead of using two reference cells that are kept at their respective resistance states $R_H$ and $R_L$, the average is obtained by determining and averaging the resistance states of one reference MTJ element that is switched between its resistances $R_H$ and $R_L$ and a parameter related to those resistances is averaged for generating a voltage or current comparator input reference. Other schemes are also conceivable, such as using both the high and low resistance states of two or more reference cells to get an average reference $(R_{H(a)}+R_{H(b)}+R_{L(a)}+R_{L(b)}/4)$, etc.

Alternative embodiments are possible wherein a reference parameter value is derived from a reference circuit comprising two MTJ reference elements of which one is at $R_H$ and the other at $R_L$ resistance state, and the reference value falls between the comparable parameter values for the $R_H$ and $R_L$ taken individually. For example, provided that the $R_H$ and $R_L$ resistances are within a typical difference range, the resistance of $R_H$ and $R_L$ in parallel is approximately equal to one half of the average of $R_H$ and $R_L$. $R_H \| R_L = (R_H*R_L)/(R_H+R_L)$. In an example where the $R_H$ and $R_L$ resistances are 250Ω and 200Ω, the average is 225Ω; the parallel resistance is 111Ω; and twice the parallel resistance is 222Ω. Both alternatives (the average resistance or twice the parallel resistance) are well spaced from $R_H$ and $R_L$ and are useful as threshold comparison references at one input to a comparator whose other input is coupled to a bit cell circuit, and the output of which represents the bit cell logic value.

Accordingly, a sense apparatus is provided, relying on a reference value for comparison, wherein the reference value is derived from two MTJ elements that are used as references, one always at high resistance (with an anti-parallel orientation of the free layer relative to the pinned layer) while the other is at low resistance (parallel orientation). The two MTJ elements have fixed resistance values, which suggests that it is not necessary to write high and low resistance states into the reference MTJ elements. (Although embodiments are possible in which the two reference MTJ elements are used alternatively, at times respectively to provide their $R_H$ and $R_L$ resistances and at other times to provide their respective $R_L$ and $R_H$ resistances.) But the two reference MTJ elements are at different resistance states, and as such, a reference current at either a positive or negative polarity when used for sending the $R_H$ and $R_L$ resistances will always be applied to one of the two MTJ elements at a polarity that presents a read-disturb risk.

According to an aspect of the present disclosure, the read bias current applied to the two reference MTJ cells for sensing their resistances and thereby defining a comparator threshold level, is applied in opposite polarities to the two reference MTJ elements. The two MTJ elements in the reference circuit are arranged so that their magnetic layers (the pinned and free layers) are encountered in reverse order along parallel bias current paths. This is accomplished in one embodiment by providing parallel bias current paths through MTJ elements that are structured in reverse order, one having the pinned layer over the free layer and the other having the free layer over the pinned layer. In another embodiment, the MTJ elements are structured in the same order but the current bias paths are coupled in order to opposite sides of the MTJ element structures. The coupling is such that a flow of electrons driven by the bias current moves electrons from the pinned layer into the free layer of the MTJ reference element in the $R_L$ low resistance state of parallel magnetic orientation, thus tending to reinforce the low resistance state due to electron spin torque transfer. The bias current moves electrons from the free layer to the pinned layer of the MTJ reference element in the $R_H$ high resistance state, which does not change the magnetic orientation in the free layer. Instead, the free layer is forced by proximity with the magnetic field of the fixed layer to assume and remain in the anti-parallel orientation that is complementary to the field of the fixed layer.

Turning to nonlimiting embodiments presented as examples, in FIG. 1 an exemplary magnetic tunnel junction (MTJ) element 35 is shown with a switching transistor 45. The MTJ element 35 comprises a pinned magnetic layer 37 which has a permanently oriented magnetic field, identified in the drawings by a one-headed arrow. A free layer 36 has a magnetic field that can be oriented the same as that of the pinned layer 37 (parallel) or in an opposite direction (anti-parallel). The free layer is identified by a two-headed arrow in FIG. 1, but in other figures and in connection with operations as discussed herein, the free layer may be shown with its changeable magnetic field set to one of the parallel or anti-parallel direction.

A thin insulating film 34, for example of magnesium oxide, is disposed between the pinned and free magnetic layers 36, 37. These layers are arranged in an order between a current source conductor 42 and the switching transistor 45 wherein current through the layers 36, 37 is switched between source and drain terminals 46, 48 via a control signal on a gate conductor 44. MTJ elements 22 are memory elements defining a bit. They might be used as logic bits in a register or as bit cells in an MRAM memory bit cell array. The parallel or anti-parallel alignments of the magnetic fields in free and pinned layers 36, 37 typically represent a logic value of themselves, but alternatively, a memory MTJ element might be part of a circuit comprising multiple MTJ elements, for example with two MTJ elements maintained in some way in complementary states. The states of parallel and anti-parallel alignment of the magnetic fields in the free and pinned layers 36, 37 are characterized by distinctly different electrical resistance serially through layers 34, 36, 37, at either positive or negative bias current polarity.

Figure 4:
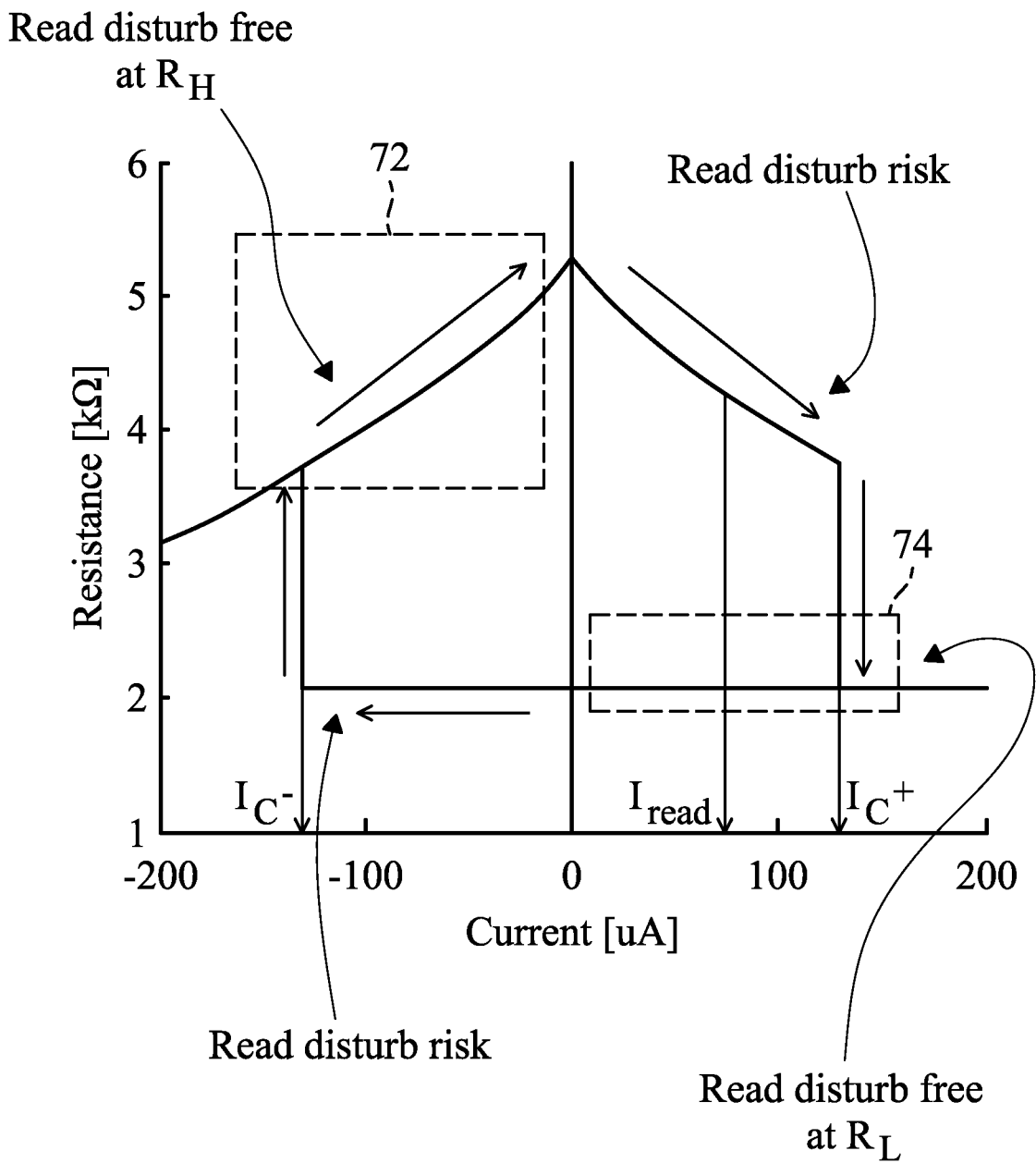
FIG. 4 is a plot of current versus resistance, demonstrating the difference in bias current needed when writing from high resistance to low resistance and vice versa, and also demonstrating what is meant by read-disturb risk if it is assumed that the plotted current values are read bias current values.

A relative alignment of the magnetic fields of the free and pinned layers, parallel or anti-parallel, respectively, can be imposed (written) by applying a current bias at positive or negative polarity, and with an amplitude sufficient to impose an alignment on the free layer 36, as shown by FIG. 4.

By electron spin transfer phenomena, electrons conducted from pinned layer 37 into free layer 36 (a negative bias current polarity) carry across the barrier layer a spin aligned to the field alignment of the pinned layer. This imposes a field alignment in free layer 36 that is the same as (parallel to) the orientation of the field in pinned layer 34. The resistance state is $R_L$.

At the opposite current polarity, a positive bias current moves electrons from the free layer into the pinned layer. The field alignment of the pinned layer is permanent and is not changed. Instead, the permanently aligned field of the pinned layer, which acts like a permanent magnet, imposes a mirror-complementary magnetization onto the free layer. The free layer assumes a field alignment that is anti-parallel to the alignment of the pinned layer. The resistance state is $R_H$.

When reading out the logic value stored in an MTJ element 35 such as a bit cell, an unknown present resistance state needs to be identified as being the high or low electrical resistance state. This is accomplished by a read-sense circuit. Referring to the schematic illustration in FIG. 2, when transistor 45 is rendered conductive by a signal on Mux line 44, bias current provided from a bias current source 52 is coupled through the MTJ element 35 formed by free and pinned layers 36, 37, separated by film 34. Inasmuch as the resistance of MTJ element 35 varies with the alignment of the magnetic field of the free layer 36 (parallel or anti-parallel to pinned layer 37), and assuming a given current bias amplitude, the voltage at one input to a voltage comparator 55 coupled to the MTJ element varies according to Ohm's Law V=IR due to the resistance state of MTJ element 35. A suitable reference voltage is applied at the other input (REF) to the voltage comparator 55. The output of the voltage comparator is zero or one depending on the result of the comparison of the voltage across the MTJ element versus the reference voltage.

In order to distinguish high and low resistance states, the reference voltage needs to be a voltage between the voltages expected across the MTJ at a given bias current and in the respective high and low resistance states. Preferably, the reference voltage is spaced from both of the two voltages that are obtained in the two resistance states. In that way, the nominal bias current produces a voltage that is distinctly higher or distinctly lower than the reference voltage. Although discussed with respect to a nominal or regulated current bias amplitude and sensing via a voltage comparator, it should be understood that the disclosed techniques can also be used by providing a nominal voltage bias across the MTJ element 35 and distinguishing for current flow that is greater or less than a threshold used for comparison in the states of high and low resistance (anti-parallel and parallel field alignments).

Figure 2:
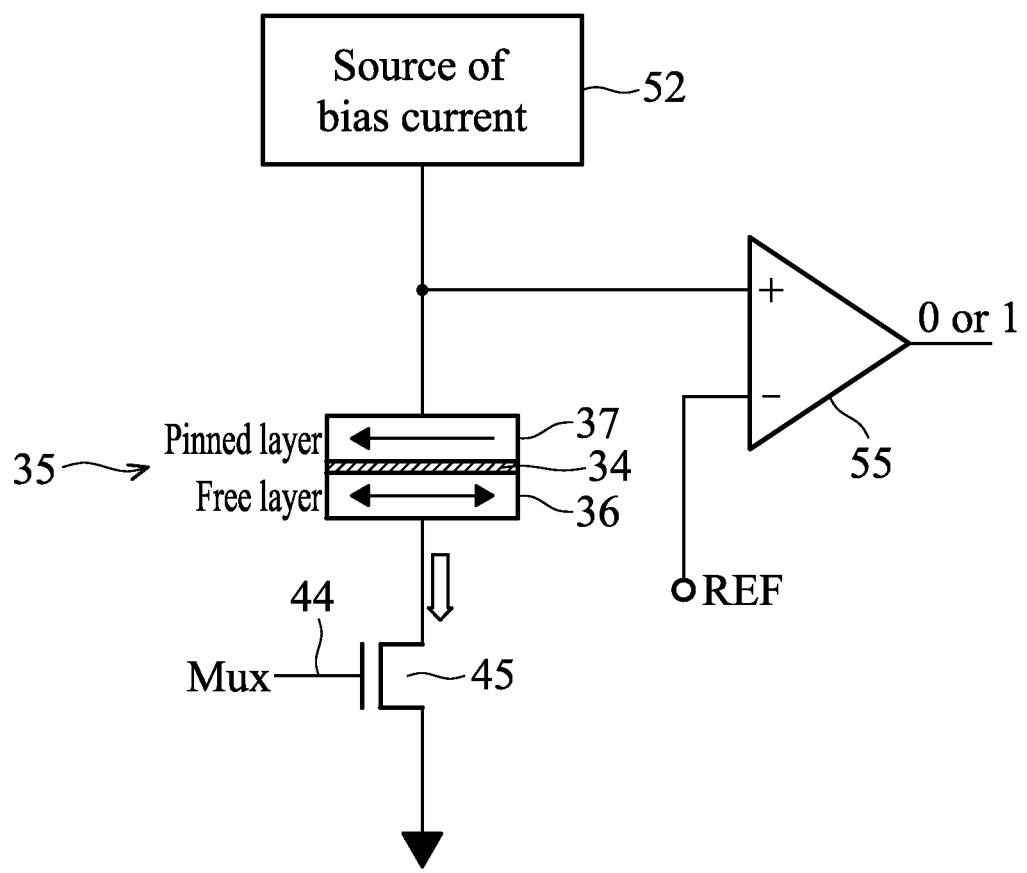

An object of this disclosure is to provide an optimal technique for applying a reference input value to a comparator such as the voltage comparator 55 in FIG. 2. The technique comprises providing an MTJ circuit arrangement, preferably manufactured according to the same process as the bit cells, to establish typical electrical conditions of voltage or current, at both high and low resistance states, for example to determine the voltage across a nominal MTJ element in both states. The reference level REF used as the threshold input to the comparator 55, is chosen as a point between the high and low resistance electrical conditions. There are several ways in which this can be accomplished, but the point is to employ reference MTJ cells in high and low resistance states (or perhaps to have one MTJ element that is placed in high and low resistance states at different times) to establish high and low resistance voltage or current levels, and to set a comparison threshold between the high and low resistance voltage or current levels.

Figure 3:
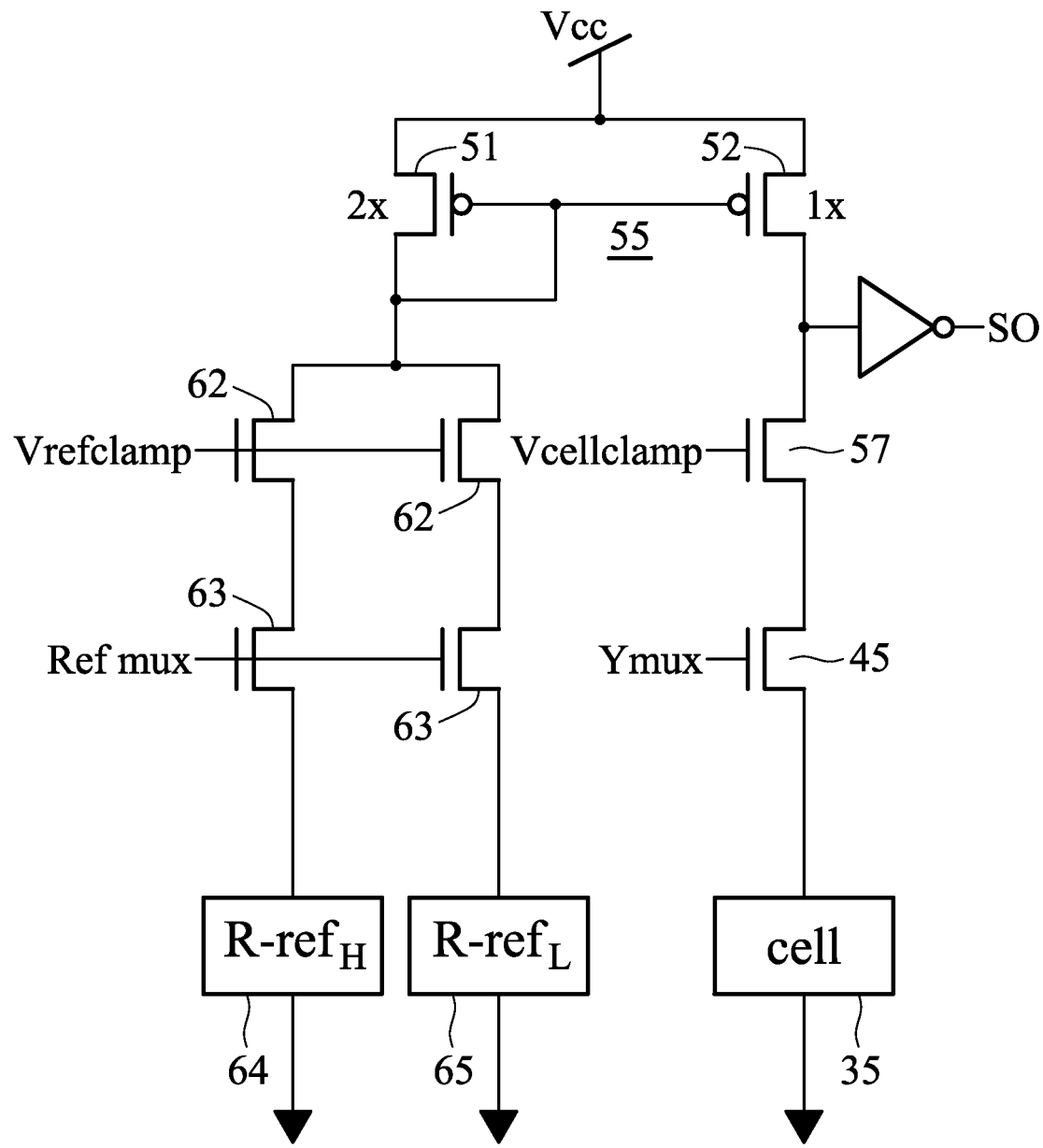

FIG. 3 shows a technique whereby two resistances 64, 65 representing high and low MTJ resistances are coupled in parallel and applied as a current sink to transistor 51 at one side of a comparator 55 comprising two PMOS transistors 51, 52, coupled such that only one of transistors 51, 52 conducts at a given time. The other side of the comparator, at transistor 52, is drained through the resistance of an MTJ element 35 whose resistance state is to be distinguished, such as a particular addressed bit cell MTJ element. Transistors 62, 63 switch current bias to the reference resistances 64, 65, and transistors 57, 45 likewise apply bias current to the cell 35. When the voltage is lower at the reference input (the source terminal of transistors 62) than across the cell (at the source terminal of transistor 57), the comparator transistors 51, 52 are turned on and the output signal SO on the inverter signals a high resistance state of cell 35. When the voltage at the reference input is higher than the voltage across cell 35, transistors 51, 52 are switched off and the output signal SO indicates a low resistance state.

Figure 5:
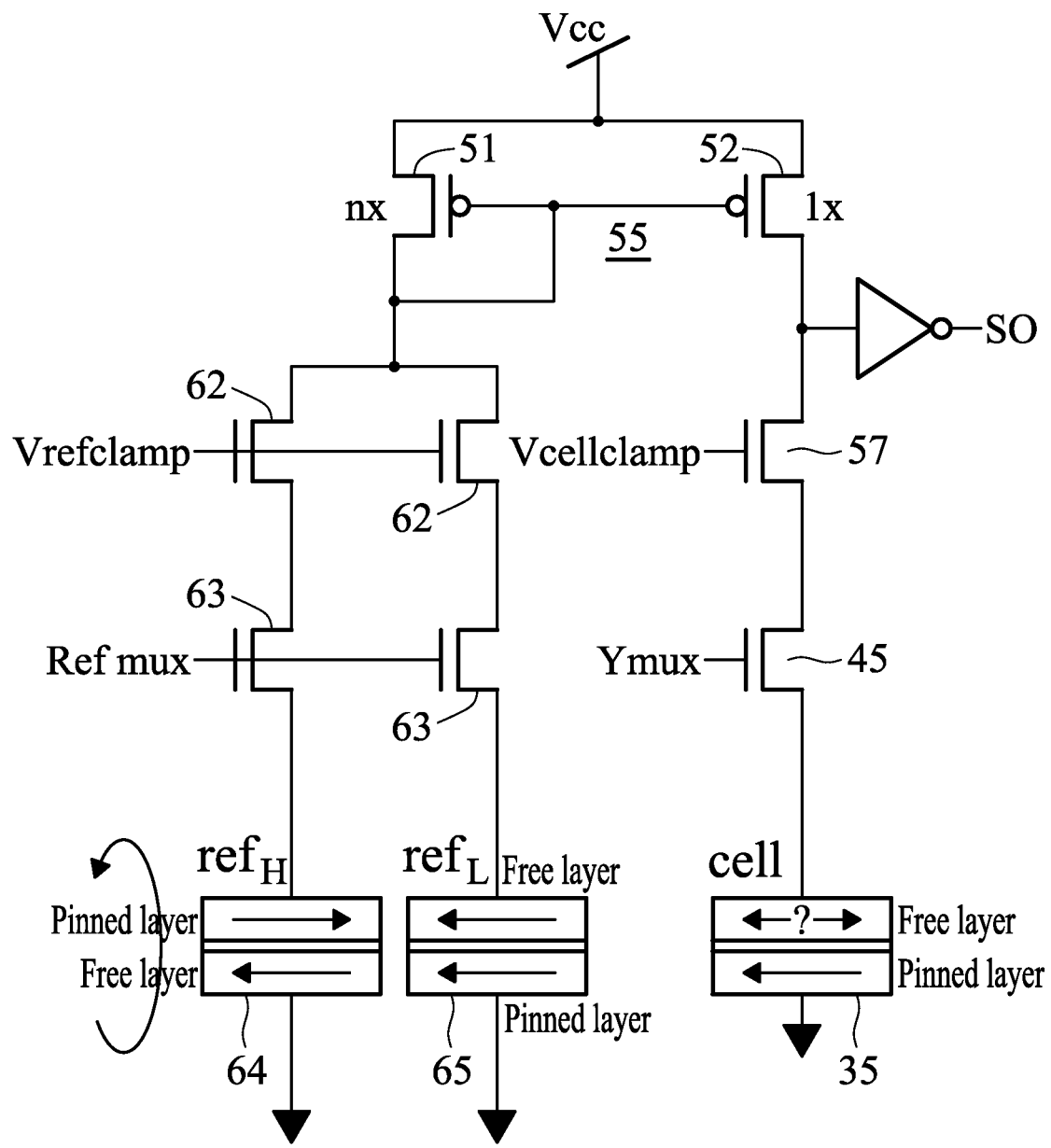
FIG. 5 shows a read-sense circuit and comparator as in FIG. 3, wherein one of the reference MTJ cells is inverted such that the current bias in both legs of the averaging reference circuit is in the read-disturb free zone of FIG. 4.
Figure 6:
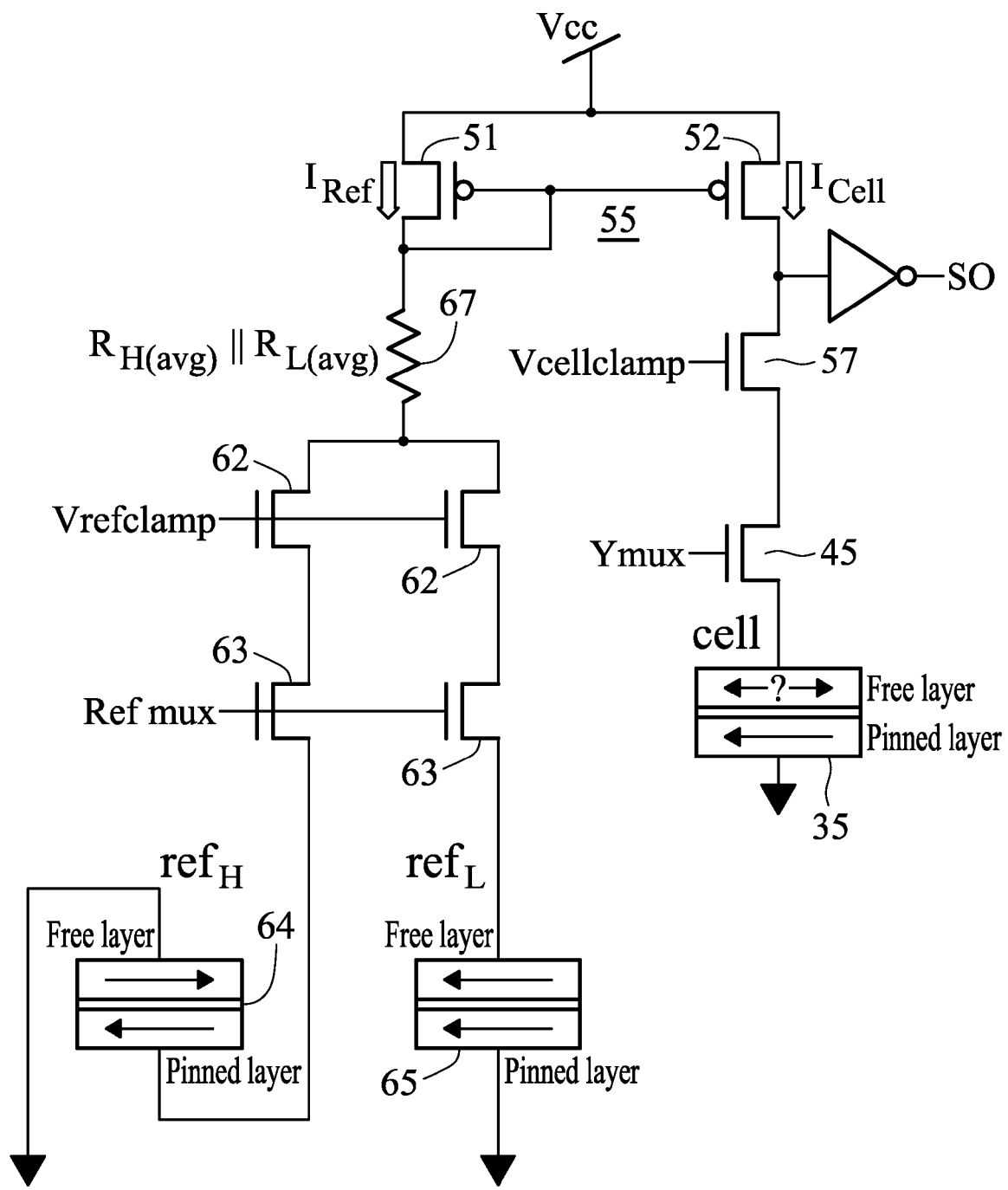
FIG. 6 is a shows a read-sense circuit and comparator as in FIG. 3, wherein one of the reference MTJ cells is wired in an inverted sense to ground, such that the current bias in both legs of the reference circuit is the same polarity, and passes the respective free, barrier and pinned layers in opposite order (in the read-disturb free zone of FIG. 4).

According to an aspect of this disclosure, the references 64, 65 used for high and low resistances R-ref$_H$ and R-ref$_L$ are MTJ elements produced in the same manufacturing process as the MTJ elements whose state is to be discerned, such as bit cells 35 of an MRAM. Process variations may cause the particular resistance levels to vary but insofar as the variations affect all the MTJ elements produced in the same process, the effects of the variations are reduced in this way. FIGS. 5 and 6 illustrate comparator arrangements as in FIG. 3, wherein the reference input to the comparator circuit 55 is coupled to two MTJ elements of which one 64 is in a high resistance state and the other 65 is in a low resistance state.

Referring to FIG. 4, the high or low resistance of an MTJ element 35 is detectable by currents at either polarity. However in some situations the combination of a present resistance state and a polarity of the bias current, when combined, can present the risk of a read disturb error. When writing to the MTJ element 35 of a bit cell, the correct polarity is used for writing particular values, e.g., positive polarity in FIG. 4 for writing from $R_H$ to $R_L$ and negative polarity for writing from $R_L$ to $R_H$. When reading at the polarity that might change the resistance state, a read disturb error is possible. That is, when reading from the bit cell 35 in FIG. 5, the resistance state is unknown, and the current bias is positive. Thus as shown in FIG. 4, the amplitude $I_{read}$ needs to be less than the amplitude $I_{C+}$.

The embodiment of FIG. 5 shows one way to prevent any read disturb risk as to the MTJ elements 64, 65 used as references to derive the comparison threshold. If one uses the same polarity of read current for two MTJ reference cells in different resistance states, and the MTJ cells are oriented the same and coupled in the same way into the reference section of the comparison circuit, one of the MTJ elements receive a bias current of the polarity that risks a read-disturb error. This situation is inherent in the MTJ elements being at different resistance states and coupled into circuits with the same polarity. However as shown in FIG. 5, one can reverse the orientation of one of the MTJ reference cells, namely the ref$_H$ cell 64 as shown, such that both reference cells 64, 65 are free of read-disturb risk.

The resistance state of cell 35 is not known, so the bias current used for reading cell 35 is kept at an amplitude less than $I_C$ (see FIG. 4). But since the resistance states of reference MTJ elements 64, and 64 is known, the safe read current polarity is known. According to the depicted embodiment in FIG. 5, the same polarity is used in both the high resistance and low resistance legs of the reference circuit. The two legs are the same. But the effective polarities at the MTJ elements 64, 65 is reversed by physically orienting the MTJ reference elements in opposite orientations of pinned-over-free and free-over-pinned layers. Thus, in FIG. 5, the drains of transistors 63, are coupled to the pinned layer of ref$_H$ MTJ 64 but to the free layer of the ref$_L$ MTJ 65 because free and pinned layers of the MTJ elements are superimposed in an order that is inverted relative to one another.

An alternative embodiment is shown in FIG. 6. In this case, the free and pinned layers are superimposed in the same order. Having the same order is practical when the layers are epitaxially deposited in process steps accomplished on an MRAM circuit substrate. As in FIG. 5, the drains of transistors 63 are coupled to the pinned layer of ref$_H$ MTJ 64 and to the free layer of the ref$_L$ MTJ 65, but that arrangement is achieved using arrangements wherein the free and pinned layers of the MTJ elements are superimposed in the same order, namely free-over-pinned as shown. The polarity of coupling of MTJ element 64 is reversed by routing the conductor from transistor 63 through the pinned layer on the underside of MTJ element 64 in the orientation shown in FIG. 6.

FIG. 6 illustrates one way to cause the total resistance of the reference circuit to approximate twice the parallel resistance of $R_H \| R_L$. In this example, a fixed resistance 67 equal to $R_{H(avg)} \| R_{L(avg)}$ is inserted in series with transistor 51 and the parallel legs containing reference MTJ elements 64, 65. An alternative embodiment (not shown) that is less affected by manufacturing tolerances, is to omit the fixed resistance 67 and provide twice the parallel resistance $R_H \| R_L$ by including two instances of an $R_H$ reference MTJ 64 and two instances of an $R_L$ reference element 65 in the respective legs of the reference circuit. In that case, the reference current $I_{Ref}$ and the memory cell current $I_{Cell}$ can be compared directly, and the result of the comparison is deemed the resistance state (and logic state) of the cell MTJ element 35.

In the embodiments of FIGS. 5 and 6, read disturb errors are prevented in the circuit legs of MTJ elements 64, 65 of the reference circuit coupled to comparator 55. However, the current polarities and circuit structural configurations from the drains of comparator transistors 51, 52 through the addressing transistors 62, 63 and 57, 45 are substantially the same. Accordingly, the protection of the reference section from read disturb errors is achieved in a simple circuit configuration requiring only one current polarity for reading the bit cell 35 and both of the two reference MTJ elements 64, 65.

It is advantageous in some applications to exploit the presence of two MTJ elements 64, 65 in the reference circuit, with an average resistance or approximated resistance of the two MTJ elements falling between their resistances in the $R_H$ and $R_L$ resistance states even when manufacturing variations cause the resistances of all the MTJ elements in an MRAM to come out higher or lower than some nominal. An average resistance can be presented by coupling MTJ elements at complementary resistance states in parallel with a correcting factor. An alternative is to provide a voltage divider to provide a reference input voltage at an average voltage that is between the voltages of the $R_H$ and $R_L$ MTJ cells as an average.

The present disclosure applicable to these and other configurations in which two MTJ elements are provided in a reference circuit and are maintained in complementary resistance states, both of which contribute to defining a reference level. The reference circuit has a first and second magnetic tunnel junction MTJ element 64, 65, of which a first MTJ element 64 is in a high resistance state and a second MTJ element 65 is in a low resistance state. The bias currents for the two reference MTJ elements 64, 65 are on distinct legs of the reference circuit but their currents are summed at the drain of transistor 51. The reference MTJ elements 64, 65 are configured so that the bias currents applied to them are conduct through the pinned and free layers of the two reference elements in opposite order.

The subject matter has been disclosed in connection with exemplary embodiments and examples. It should be understood that the subject matter is not limited to the examples, and reference should be made to the appended claims to assess the scope of the invention in which exclusive rights are claimed.

We claim:

1. A digital memory, comprising:
    at least one magneto-resistive memory cell comprising a magnetic tunnel junction element with a pinned magnetic layer having a permanently oriented magnetic field and a free magnetic layer having a magnetic field component that is changeably alignable parallel to magnetic field of the pinned layer, in a state of low electrical resistance, and anti-parallel to the magnetic field of the pinned layer in a state of high electrical resistance, wherein a data value is changeably stored in the cell by alignment of the magnetic field of the free layer relative to the pinned layer, and is detectable by differences in a cell value of an electrical parameter produced by the memory cell when subjected to a cell bias current;
    a reference circuit comprising a high resistance reference, a low resistance reference, and at least two reference magnetic tunnel junction elements operable in tandem, one of the reference magnetic tunnel junction elements being in the high resistance state and another of the reference magnetic tunnel junction elements being in the low resistance state, wherein the reference circuit produces an electrical parameter having a reference value when subjected to a reference bias current;
    a comparator circuit coupled to compare the reference value versus the cell value, the comparator having an output reading out the data value corresponding to the cell value being greater than or less than the reference value;
    wherein the reference value represents a value falling between values of the electrical parameter produced by the memory cell in the states of high and low electrical resistance.

2. The digital memory of claim 1, wherein the reference value is derived from an average of the values of the electrical parameter produced by the memory cell in the states of high and low electrical resistance.

3. The digital memory of claim 1, wherein the reference value is derived from a value of the electrical parameter produced by a parallel resistance of the high and low electrical resistances subjected to the current bias.

4. The digital memory of claim 1, wherein the comparator is a voltage comparator and the two reference magnetic tunnel junction elements of the reference circuit are coupled in parallel at one input to the comparator, and the memory cell is coupled to a second input to the comparator.

5. The digital memory of claim 4, wherein the comparator comprises two complementary coupled MOS transistors coupled to a common voltage supply and operable to change state with a resistance of the memory cell being greater or less than a reference resistance between the high resistance and low resistance of the reference magnetic tunnel junction elements while in different ones of said high and low resistance states.

6. The digital memory of claim 5, wherein the reference magnetic tunnel junction elements providing the high and low resistance states are coupled along parallel current bias paths of a same polarity.

7. The digital memory of claim 6, wherein the reference magnetic tunnel junctions elements providing the high and low resistance states are coupled along parallel current bias paths in an orientation such that both of said magnetic tunnel junction elements remain biased at a polarity the precludes read-disturb errors.

8. The digital memory of claim 7, wherein the free and pinned magnetic layers of the reference magnetic tunnel junction elements are superimposed in opposite order over one another and are coupled in current bias paths following comparable routes.

9. The digital memory of claim 7, wherein the free and pinned magnetic layers of the reference magnetic tunnel junction elements are superimposed in a same order over one another and are coupled in current bias paths following oppositely oriented routes through the free and pinned layers thereof.

10. A method for configuring an STT-MRAM, comprising:
    providing memory bit cells comprising magnetic tunnel junction elements having high resistance and low resistance states determined by pinned and free magnetic layers that have magnetic fields aligned parallel in a low resistance state and anti-parallel in a high resistance state;
    applying read current bias to the bit cells for sensing one of the high and low resistance states while coupling the bit cells to one input of a voltage comparator;
    coupling a second input of the voltage comparator to a reference circuit containing two reference magnetic tunnel junction elements, while holding the reference magnetic tunnel junction elements in high and low resistance states, respectively, and causing the reference circuit to apply to the second input of the voltage comparator a voltage based on a reference resistance between the high and low resistance states;
    wherein the two reference magnetic tunnel junction elements of the reference circuit are coupled into parallel current bias legs, and the pinned and free layers of the reference magnetic tunnel junction elements are oriented in respective ones of the current bias legs such that both of the reference magnetic tunnel junction elements are biased at a polarity that is free of risk of read disturb errors.

11. The method of claim 10, wherein the free and pinned magnetic layers of the reference magnetic tunnel junction elements are superimposed in opposite order over one another and are coupled in current bias paths following comparable routes.

12. The method of claim 10, wherein the free and pinned magnetic layers of the reference magnetic tunnel junction elements are superimposed in a same order over one another and are coupled in current bias paths following oppositely oriented routes through the free and pinned layers thereof.

13. An improved MRAM memory configuration having an array of magnetic tunnel junction bit cells with free and pinned magnetic layers, the bit cells being writable to parallel and anti-parallel magnetic field alignments of the layers for carrying a logic value in one of a low resistance and high resistance state, wherein the logic value of a bit cell is read out by comparing a resistance of the bit cell as coupled into a bias circuit, versus a reference resistance, using a comparator responsive to one of voltage and current, wherein the comparator has inputs coupled to the bit cell and to a reference circuit that provides the reference resistance, wherein the improvement comprises:

the reference circuit comprises two reference magnetic tunnel junction elements that are set at low resistance and a high resistance respectively, and the reference resistance falls between high and low resistances of the bit cell in the high and low resistance states;

wherein the reference magnetic junction elements in the reference circuit are arranged along a bias path in a bias circuit that substantially parallels the bias circuit coupled to the bit cell;

wherein the reference magnetic junction elements in the reference circuit are both oriented in the bias path at a polarity that prevents risk of read-disturb errors.

14. The improved MRAM memory configuration of claim 13, wherein the reference magnetic junction elements in the reference circuit are coupled into parallel bias circuit legs of a same polarity and the reference magnetic junction elements in the reference circuit deposited in opposite order of free-over-pinned magnetic layers such that both said reference magnetic junction elements in the reference circuit are free of said risk of read-disturb errors at said same polarity.

15. The improved MRAM memory configuration of claim 13, wherein the reference magnetic junction elements in the reference circuit are coupled into bias circuit legs that have a same polarity and a same bias current path up to said the reference magnetic junction elements, and wherein the bias current path is routed from the free layer to the pinned layer of one of said reference magnetic terminal junction elements and is routed from the pinned layer to the free layer of the other of the reference magnet terminal junction elements.

16. The improved MRAM memory configuration of claim 13, wherein the free and pinned layers of two said reference magnetic terminal junction elements are physically superimposed on an integrated circuit in a same order.

17. The improved MRAM memory configuration of claim 13, wherein the free and pinned layers of two said reference magnetic terminal junction elements are physically superimposed on an integrated circuit in opposite order.

18. The improved MRAM memory configuration of claim 13, wherein the MRAM bit cell and the reference magnetic terminal junction elements comprise spin transfer torque MRAM devices.

19. The improved MRAM memory configuration of claim 13, wherein the reference magnetic terminal junction elements and the comparator are associated with a bit position and are used to sense resistance states for a bit at said bit position in addressed memory words in a digital memory bit cell array.

* * * * *